United States Patent
Bass et al.

(10) Patent No.: US 6,540,530 B2
(45) Date of Patent: Apr. 1, 2003

(54) SPRING GASKET FOR GROUNDING CIRCUIT CARD BRACKETS TO A SLOTTED PANEL WITHIN A COMPUTING SYSTEM

(75) Inventors: Timothy S. Bass, Chapel Hill, NC (US); Dean F. Herring, Youngsville, NC (US); John Robert Kirksey, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/725,555

(22) Filed: Nov. 29, 2000

(65) Prior Publication Data

US 2002/0064982 A1 May 30, 2002

(51) Int. Cl.[7] ................................................. H01R 4/66
(52) U.S. Cl. ........................................................ 439/92
(58) Field of Search ............................ 439/92; 361/801, 361/818; 174/35 GC

(56) References Cited

U.S. PATENT DOCUMENTS

| | | | | |
|---|---|---|---|---|
| 5,650,922 A | * | 7/1997 | Ho | ............................. 361/799 |
| 5,679,923 A | * | 10/1997 | Le | ............................. 174/35 R |
| 5,856,632 A | * | 1/1999 | Bostrom et al. | ....... 174/35 GC |
| 5,929,376 A | * | 7/1999 | Doun et al. | ................ 174/35 R |
| 5,957,465 A | * | 9/1999 | Gonsalves et al. | ........... 277/637 |
| 6,201,711 B1 | * | 3/2001 | Cherniski et al. | ........... 361/800 |

* cited by examiner

Primary Examiner—Gary Paumen
Assistant Examiner—Ann McCamey
(74) Attorney, Agent, or Firm—Ronald V. Davidge, Inc.

(57) ABSTRACT

A computing system includes a number of circuit cards fastened by brackets to a slotted panel, which has slots allowing the attachment of external cables to the circuit cards. Electrical grounding between the slotted panel and the brackets is achieved through the use of a conductive gasket extending along an inner surface of the slotted panel. The conductive gasket includes a central web, a number of contact bumps extending from the central web to the slotted panel, and a number of contact bumps extending from the central web to the brackets. Contact bumps thus extending in opposite directions are placed in alternating positions along the central web, so that the central web is deflected as the contact gasket is compressed.

12 Claims, 3 Drawing Sheets

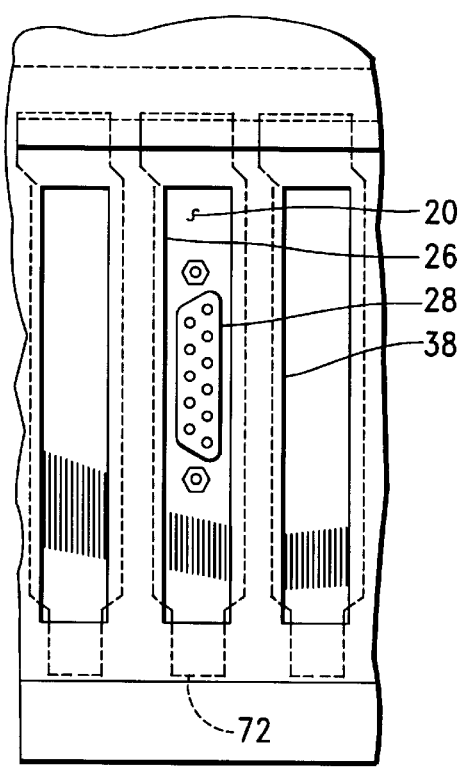
FIG. 2
PRIOR ART
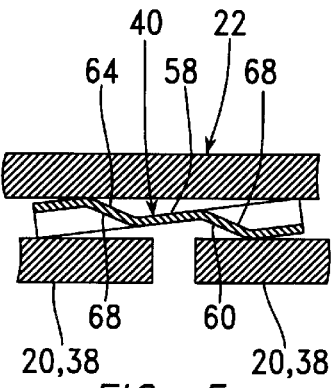
FIG. 5
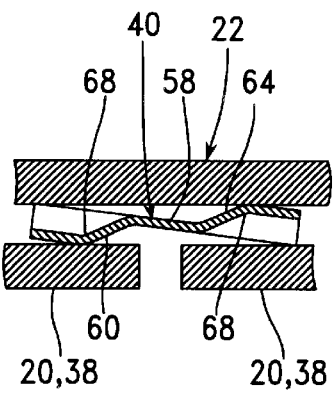
FIG. 6
FIG. 3
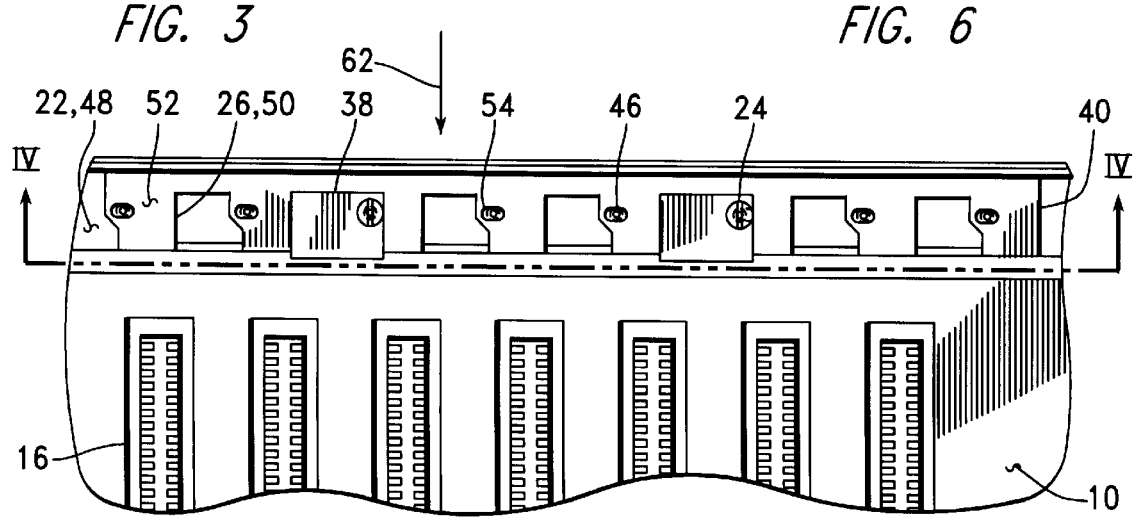

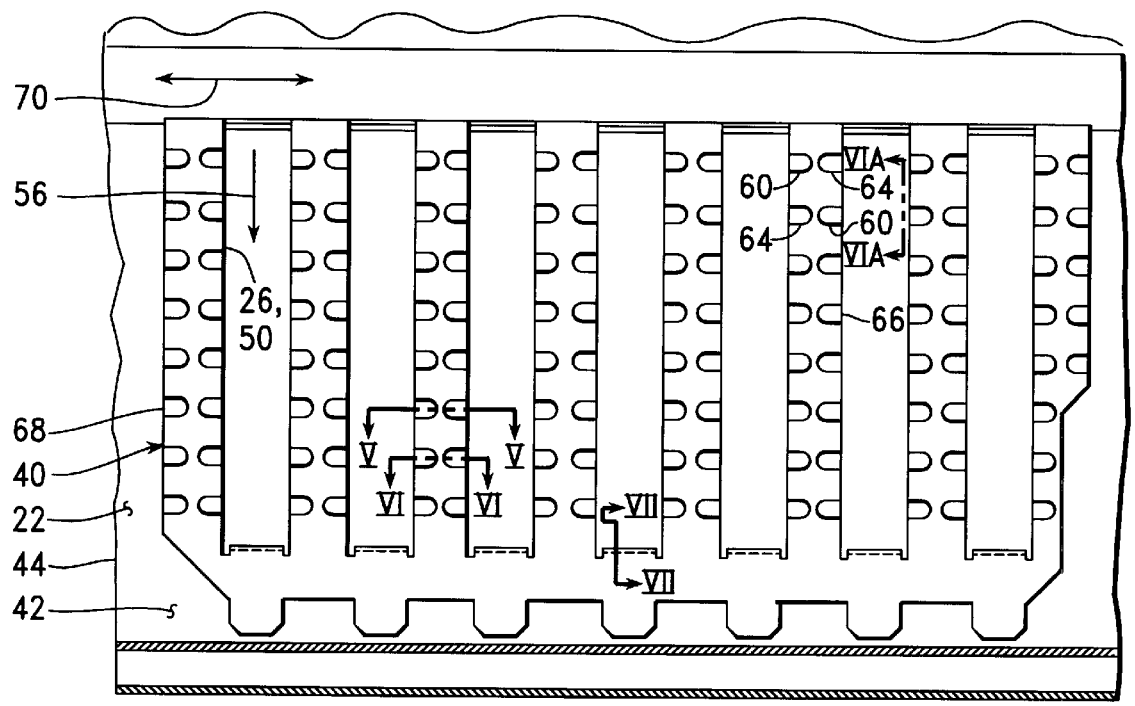
FIG. 4
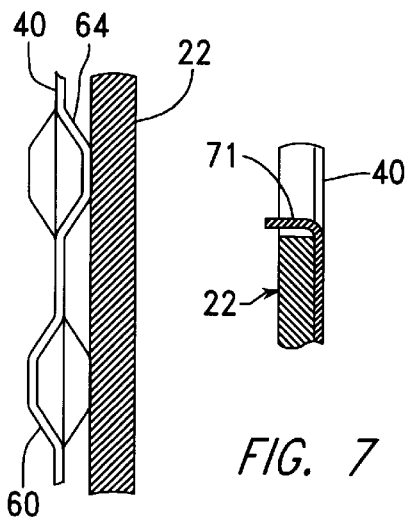
FIG. 6A
FIG. 7
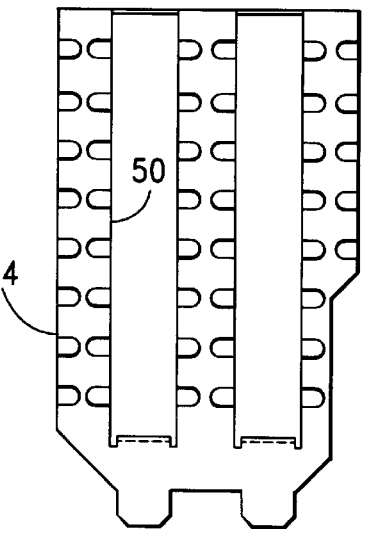
FIG. 8
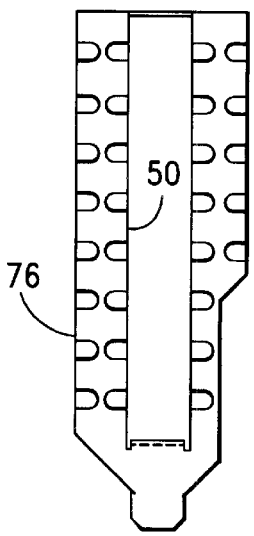
FIG. 9

SPRING GASKET FOR GROUNDING CIRCUIT CARD BRACKETS TO A SLOTTED PANEL WITHIN A COMPUTING SYSTEM

BACKGROUND OF THE INVENTION

1. Field of the Invention

This invention relates to a conductive gasket for improving electrical grounding between adjacent conductive parts, and, more particularly, to a gasket for improving electrical grounding within a computing system between a slotted panel through which connectors of circuit cards extend for the attachment of external cables and brackets mounting such circuit cards.

2. Background Information

FIGS. 1 and 2 are fragmentary elevations of a conventional computing system 8 including a mother board 10 and a conventional circuit card 12 having a tab 14 inserted within a card edge connector 16 of the mother board 10. FIG. 1 is a fragmentary vertical cross-sectional elevation of the computing system 8, while FIG. 2 is a fragmentary rear elevation thereof.

The rear end 18 of the circuit card 12 includes a card bracket 20 attached to a slotted panel 22, forming part of the computing system, by means of a screw 24. An individual slot 26 within the slotted panel 22 provides a space through which an I/O connector 28 extends for attachment to an external cable (not shown). Thus the card 12 is rigidly held in place by the screw 24 near its top edge 30 and by the engagement of its tab 14 with the card edge connector 16 near its lower edge 32. The mother board 10 may be a relatively large system (or planar) board extending inwardly adjacent a cover 36 of the computing system. Alternately, the mother board 10 may be a riser board extending perpendicularly from the system (or planer) board to provide for the attachment of one or more circuit cards 12. Typically, the computing system 8 includes a number of card edge connectors 16 and a number of slots 26, each of which is located in a standard way relative to a connector 16 to provide for the installation of a standard type of circuit card 12. While each circuit card 12 has a card bracket 20, not all cards 12 have I/O connectors 28. Cards 12 without I/O connectors, which are not configured for attachment to external cables, include brackets 20 which are used to close an associated slot 26 within the slotted panel 22. When a circuit card 12 is not placed in one of the card edge connectors 16, the associated slot 26 is closed by a filler bracket 38, which is not attached to a circuit card 12. Like the card brackets 20, each filler bracket 38 is fastened in place using a screw 24.

Electrical contact between the card bracket 20 and the slotted panel 22 is typically used to provide for electrical grounding of circuits within the circuit card 12 and within an external cable (not shown) connected to the I/O connector 28. This contact may form a portion of multiple grounding points. Electrical contact between the card bracket 20 and the slotted panel 22 is also used to close a slot through which radio-frequency electromagnetic noise could otherwise be radiated to interfere with electronic communications.

A problem with this conventional approach arises from the uncertain nature of the electrical contact established between the card bracket 20 and the slotted panel 22. While specific contact pressure between the card bracket 20 and the slotted panel 22 is established adjacent the head of screw 24, the contact pressure at other locations between these parts depends on the slightly variable dimensions of parts, including their flatness.

A card bracket formed from a thin metal sheet, having a number of individual formed cantilevers to provide specific points for contact with a slotted panel, has been used in a number of circuit cards developed particularly for use with the IBM MICRO CHANNEL architecture. An example of this type of card bracket, configured particularly for use with a daughter card attached to the circuit card, is shown in U.S. Pat. No. 5,980,275. However, this type of card bracket must be used with a much different type of slotted panel having wide edges along which the contact cantilevers slide, and with cards not having formed brackets of the standard types used with the Industry Standard Architecture (ISA) and the Peripheral Card Interconnect (PCI) architecture. What is needed is a gasket providing specific contact locations which may be used with cards having such standard brackets, since such cards are widely available.

A number of conductive gaskets for various applications, other than the grounding of card brackets of slotted panels, are also formed to include a number of cantilevers providing specific points of contact. Such gaskets have a disadvantage of nesting together when they are shipped or otherwise handled in quantities, with the cantilevers of different gaskets interlocking so that the gaskets cannot easily be separated without damage. What is needed is a gasket configuration producing parts which can be handled and shipped together without this kind of nesting. Furthermore, such gaskets are often easily damaged during the handling and installation of associated parts, since the easily-twisted cantilevers may become snagged on other surfaces.

Conductive gaskets formed of fine-diameter woven conductive fibers or conductive fibers compressed into a matted, felt-like material have also been used for various applications other than the grounding of such card brackets. Gaskets formed in this way have disadvantages of a difficult fabrication process and of attendant relatively high costs.

U.S. Pat. No. 5,825,634 describes the use of an undulating or serpentine spring gasket in an assembly including a shielding cover fastened in place to extend along a portion of a surface of a circuit board. The spring extends between a peripheral edge of the cover and an electrical contact extending along the surface of the circuit board adjacent the peripheral edge. The relatively long and gentle undulations of the spring material produce alternating high and low areas. While a spring of this type can undergo relatively large deflections to provide a mechanically flexible interface between the mating parts, the resulting deflections of the spring, which cause each leg of the spring to lengthen as the spring is compressed between mating parts make it difficult to control the overall dimensions of the spring gasket in use. In the application of the present invention, i.e. in the grounding of card brackets to a slotted panel, overall dimensions must be carefully controlled, since a number of parts have to fit together in a small area.

SUMMARY OF THE INVENTION

Accordingly, it is a first objective of the present invention to provide a spring gasket causing electrical contact to be made at particular locations between a card bracket in a computing system and a slotted panel providing access to a circuit card I/O connector for external cables.

It is a second objective of the present invention to provide a spring gasket which is flexible, allowing electrical contact to occur despite variations in the dimensional configurations of adjacent parts.

It is a third objective of the present invention to provide a spring gasket in which the length of various legs within the gasket does not substantially change as the spring gasket is compressed.

It is a fourth objective of the present invention to provide a spring gasket which does not nest with other similar parts during storage or shipment.

It is a fifth objective of the present invention to provide a spring gasket which is not easily damaged by contact with adjacent parts during installation and handling.

According to a first aspect of the present invention, a conductive gasket for providing electrical conductivity between adjacent first and second conductive members separated in a first direction is provided. The conductive gasket includes a central web, a first plurality of contact bumps extending from the central web in the first direction; and a second plurality of contact bumps extending from the central web opposite the first direction, wherein contact bumps in the first and second pluralities of contact bumps are arranged in alternating patterns along the central web to include contact bumps in the first plurality of contact bumps adjacent contact bumps in the second plurality of contact bumps.

BRIEF DESCRIPTION OF THE DRAWINGS

FIG. 2 is a fragmentary rear elevation of the computing system of FIG. 1, showing a slotted panel and circuit card brackets;

FIG. 3 is a fragmentary plan view of the computing system of FIG. 1, showing a spring gasket installed therein in accordance with the present invention;

FIG. 4 is a fragmentary cross-sectional elevation of the computing system of FIG. 1, including the spring gasket of FIG. 3, taken as indicated by section lines IV—IV in FIG. 3.

FIG. 5 is a fragmentary cross-sectional plan view of the slotted panel and circuit card brackets of FIG. 2, together with the spring gasket of FIG. 3, taken as indicated by section lines V—V in FIG. 4;

FIG. 6 is a fragmentary cross-sectional plan view of the slotted panel and circuit card brackets of FIG. 2, together with the spring gasket of FIG. 3, taken as indicated by section lines VI—VI in FIG. 4;

FIG. 6A is a fragmentary vertical cross-sectional elevation of the slotted panel of FIG. 2, together with the spring bracket of FIG. 3, taken as indicated by section lines VIA—VIA in FIG. 4;

FIG. 7 is a fragmentary vertical cross-sectional elevation of the slotted panel of FIG. 2, together with the spring gasket of FIG. 3, taken as indicated by section lines VII—VII in FIG. 4;

FIG. 8 is a front elevation of a spring gasket built in accordance with a first alternative version of the present invention; and FIG. 9 is a front elevation of a spring gasket built in accordance with a second alternative version of the present invention.

DETAILED DESCRIPTION OF THE INVENTION

Figure 1:
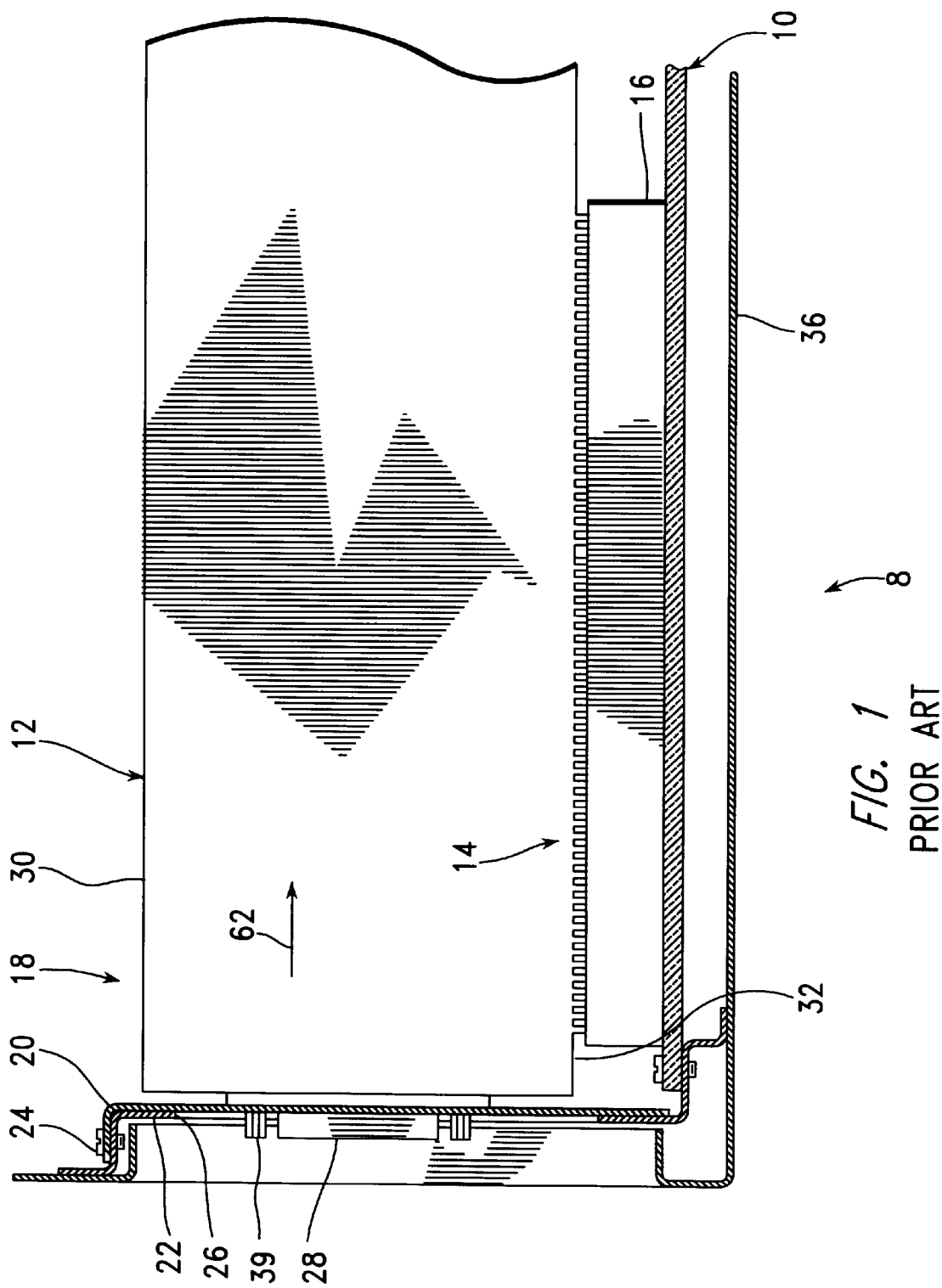
FIG. 1 is a fragmentary cross-sectional end elevation of a computing system including a mother board and a conventional circuit card having a tab inserted within a card edge connector of the mother board.

While FIGS. 1 and 2 have been described as showing the prior art, continued reference will be made to these figures, and reference numerals originally used in reference to these figures will continue to be used, as devices configured in accordance with the present invention are used with the prior art devices of FIGS. 1 and 2.

FIG. 3 is a fragmentary top view of the computer system 8, having installed therein a spring gasket 40 configured in accordance with the present invention, together with a pair of filler brackets 38. The remaining positions in which filler brackets 38 and card brackets 20 can be installed are shown with such brackets not being installed in order to reveal the structure of the spring gasket 40.

FIG. 4 is a fragmentary cross-sectional front elevation of the computer system 8, having installed therein the spring gasket 40. This cross-section view is taken in the direction indicated by section lines IV—IV in FIG. 3 to show a portion of the interior surface 42 of the rear wall 44 of the computer. In the example of this figure, the slotted panel 22 includes seven slots 26, each of which is to be internally covered by either a card bracket 20 or a filter bracket 38 (as shown in FIG. 2). However, in FIG. 3, these brackets 20, 26 and the various circuit cards 12 are not shown as installed, in order that the details of the spring gasket 40, which is shown as installed, may be easily seen.

Referring to FIGS. 3 and 4, the spring gasket 40 is installed inside the slotted panel 22 to provide for electrical contact between the slotted panel 22 and any combination of card brackets 20 (shown in FIG. 2) and filler brackets 38 which may be fastened in place with screws 24 extending through holes 46 along a ledge 48 of the slotted panel 22. The spring gasket 40 includes a slot 50 aligned with each of the slots 26 in the slotted panel 22, so that each I/O connector 28 extending outward from a card bracket 20, as shown in FIG. 1, can extend through a slot 50 in the in the spring gasket 40 as well as a slot 26 in the slotted panel 22. The spring gasket 40 also includes an upper ledge 52, which is fastened in place to extend along the ledge 48 of the slotted panel 22. This upper ledge 52 includes a number of clearance holes 54, which are brought into alignment with the holes 46 extending along the ledge 48 of the slotted panel 22. When a combination of circuit cards 12, having card brackets 20, and filler brackets 38 is installed using screws 24 extending through the clearance holes 54 into the holes 46, the spring gasket 40 is clamped between the slotted panel 22 and the brackets 20, 38.

FIGS. 5, 6, and 6A are fragmentay cross-sectional view of the computer system 8, taken in the direction indicated by section lines V—V, VI—VI, and VIA—VIA, respectively, in FIG. 3, to show contact conditions occuring among the slotted panel 22, the spring gasket 40, and a pair of brackets, each of which may be either a card bracket 20 or a blank bracket 38. These brackets 20 or 38 are shown as installed in FIGS. 5 and 6 but not in FIGS. 3 and 6A.

Referring to FIGS. 4–6, the portion of the spring gasket 40 extending downward, in the direction of arrow 56, between the slotted panel 22 and the brackets 20, 38, includes a central web 58, a first plurality of contact bumps 60 extending inward, in the direction of arrow 62, from the central web 58, and a second plurality of contact bumps 64 extending outward, opposite the direction of arrow 62, from the central web 58. Preferably, the spring gasket is stamped and formed from a spring metal sheet, such as a 0.1 mm (0.004 in.) thick sheet of half-hard stainless steel, with the contact bumps 60, 64 extending 0.75 mm (0.03 in.) from the center of the central web 58. Each of the contact bumps 60, 64 preferably extends to an edge 66 of the spring gasket 40.

Unlike the cantilevers of various gaskets and brackets described in the prior art, the contact bumps 60, 64 are not defined by slots extending into the web 58, but are rather formed such that the perimeter of the bump is continuous with the central web 58. Therefore, the contact bumps 60, 64 provide a number of contact surfaces which are not easily twisted or otherwise damaged during handling and installation of the spring gasket 40, or during a subsequent installation of a circuit card 12 having a bracket 20 which is slid along the spring gasket 40 during the installation of the card 12. Furthermore, this lack of slots extending into the web 58 prevents a number of spring gaskets 40 which are stored or shipped together from nesting in a way preventing the easy separation of the parts without damage. In this way, another advantage over prior-art devices having cantilevers is achieved.

The complex curvature 68 forming the contact bumps 60, 64 limits the flexibility of each of these bumps 60, 64, causing most of the deflection occurring with the compression of the spring gasket 40 between the slotted panel 22 and the brackets 20, 38 to occur within the central web 58. Preferably, the outward-extending contact bumps 60 and inward-extending contact bumps 64 are arranged in alternating positions, with the outward extending contact bumps 60 being formed at points of a first rectangular array, and with the inward-extending contact bumps 64 being formed at points of a second rectangular array. These arrays extend in the vertical direction indicated by arrow 56 and in the horizontal direction indicated by arrow 70. In the example of FIG. 4, both the first and second rectangular arrays are divided by intervening slots 50, having sides also extending in the vertical and horizontal directions indicated by arrows 56 and 70, respectively. Adjacent outward-extending contact bumps 60 are separated by individual inward-extending contact bumps 64, and adjacent inward extending contact bumps 64 are separated by individual outward-extending contact bumps 60, so that compression of the spring gasket 40 results in twisting of the central web 58.

FIG. 7 is a fragmentary vertical cross-sectional view of the spring gasket 40 installed on the slotted panel 22, taken as indicated by section lines VII—VII in FIG. 4 to show the lower edge of a slot 50, which is formed by a tab 71 extending outward to prevent the lower end 72 of a card bracket 20 (shown in FIG. 2) from catching on a sharp edge of the spring gasket 40 as a card 12 (shown in FIG. 1) is installed against the spring gasket by sliding downward.

In accordance with a preferred version of the present invention, the spring gasket 40 and the slotted panel 22 have equal numbers of slots, with the slots 50 of the spring gasket 40 being in alignment with the slots 26 of the slotted panel 22. To this end, the spring gasket may be formed in a number of different configurations having different numbers of slots 50. For example, FIG. 8 is a front elevation of a spring gasket 74 having two slots 50, and FIG. 9 is a front elevation of a spring gasket 76 having only one slot 50. Alternately, a spring gasket may be placed to ground the bracket 20 of only one card, or of several cards among many, where such grounding is particularly important.

While the invention has been described in its preferred forms or embodiments with some degree of particularity, it is understood that this description has been given only by way of example, and that numerous changes in details of construction, fabrication, and use, including changes in the combination and arrangement of parts, may be made without departing from the spirit and scope of the invention.

We claim:

1. A conductive gasket for providing electrical conductivity between adjacent first and second conductive members separated in a first direction, wherein said gasket comprises:
   a central web;
   a first plurality of contact bumps extending from said central web in said first direction, and
   a second plurality of contact bumps, extending from said central web opposite said first direction, wherein contact bumps in said first and second pluralities of contact bumps are arranged in alternating patterns along said central web to include contact bumps in said first plurality of contact bumps adjacent contact bumps in said second plurality of contact bumps, wherein each contact bump within said first and second pluralities of contact bumps extends within said central web, being continuously connected to said central web along a perimeter of said contact bump extending along each portion of said central web adjacent said contact bump.

2. The conductive gasket of claim 1, wherein said conductive gasket is formed from a metal sheet.

3. The conductive gasket of claim 1, wherein
   contact bumps in said first plurality of contact bumps are arranged in a first rectangular array,
   contact bumps in said second plurality of contact bumps are arranged in a second rectangular array,
   adjacent contact bumps in said plurality of contact bumps are spaced apart along said control web in a second direction and in a third direction perpendicular to said second direction,
   adjacent contact bumps in said second plurality of contact bumps are spaced apart along said central web in said second and third directions,
   each contact bump in said first plurality of contact bumps is offset from an adjacent contact bump in said second plurality of contact bumps in said second and third directions.

4. The conductive gasket of claim 4, wherein each contact bump in said second plurality of contact bumps is offset from an adjacent contact bump in said first plurality of contact bumps in said second and third directions.

5. The conductive gasket of claim 1, additionally comprising a plurality of apertures, wherein
   said first and second pluralities of contact bumps extend in columns along opposite sides of each aperture within said plurality of apertures,
   within each of said columns, contact bumps within said first plurality of contact bumps extend between adjacent contact bumps within said second plurality of contact bumps, and
   within each of said column, contact bumps within said second plurality of contact bumps extend between adjacent contact bumps within said first plurality of contact bumps.

6. The conductive gasket of claim 5, additionally comprising a tab extending in said first direction at an end of each aperture, between said opposite sides of each aperture within said plurality of apertures.

7. Electronic apparatus comprising a circuit card having a card bracket,
   a slotted bracket having a slot aligned with said card bracket;
   a slotted gasket having a slot aligned with said slot of said slotted bracket extending between said card bracket and said slotted bracket, wherein said slotted gasket includes a central web, a first plurality of contact bumps extending from said central web to contact said slotted bracket, and a second plurality of contact bumps extending from said central web to contact said card bracket, wherein contact bumps in said first and second pluralities of contact bumps are arranged in alternating patterns along said central web adjacent parallel sides of said slot to include contact bumps in said first plurality of contact bumps adjacent contact bumps in said second plurality of contact bumps, wherein each contact bump in said first and second pluralities extends within said central web, being continuously connected to said central web along a perimeter of said contact bump extending along each portion of said central web adjacent said contact bump.

8. The electronic apparatus of claim 9, wherein said conductive gasket is formed from a metal sheet.

9. The electronic apparatus of claim 9, wherein said circuit card is installed within said apparatus by moving said circuit card in a first direction along said slotted gasket, and said slot in said slotted gasket includes an end formed by a tab extending opposite said first direction and outward into said slot within said slotted bracket.

10. The apparatus of claim 9, additionally comprising a tab extending in said first direction at a side of each slot in said plurality of apertures.

11. Apparatus for mounting and electrically grounding a plurality of circuit cards having brackets along an external side of a computing system, wherein said apparatus comprises:

a slotted panel forming a portion of said external side, wherein said slotted panel includes a plurality of mounting holes for attachment of said brackets and a plurality of slots extending adjacent brackets, attached within said mounting holes to provide for cable attachment to connectors extending though said brackets; and a conductive gasket held against an interior surface of said slotted panel, wherein said conductive gasket includes a plurality of mounting holes, aligned with said plurality of mounting holes in said slotted panel, a plurality of slots aligned with said plurality of slots in said slotted pane, a central web, a first plurality of contact bumps extending in a first direction from said central web into contact with said slotted panel, and a second plurality of contact bumps extending from said central web opposite said first direction, wherein contact bumps in said first and second pluralities of contact bumps are arranged in alternating patterns along said central web adjacent parallel sides of said slot to include contact bumps in said first plurality of contact bumps adjacent contact bumps in said second plurality of contact bumps, wherein each contact bump in said first and second pluralities extends within said central web, being continuously connected to said central web along a perimeter of said contact bump extending along each portion of said central web adjacent said contact bump.

12. The apparatus of claim 11, wherein contact bumps in said first plurality of contact bumps are arranged in a first rectangular array, contact bumps in said second plurality of contact bumps are arranged in a second rectangular array, adjacent contact bumps in said first plurality of contact bumps are spaced apart along said central web in a second direction and in a third direction perpendicular to said second direction, adjacent contact bumps in said second plurality of contact bumps are spaced apart along said central web in said second and third directions, individual contact bumps in said first plurality of contact bumps are spaced between adjacent contact bumps in said second plurality of contact bumps, said first and second rectangular arrays are divided into pluralities of arrays by said plurality of slots in said conductive gasket, and each slot within said plurality of slots in said conductive gaskets is rectangular, having sides extending in said second and third directions wherein said adjacent contact bumps in said second plurality of contact bumps are spaced between contact bumps in said first plurality of contact bumps.

* * * * *